US007319621B2

(12) United States Patent
Ba

(10) Patent No.: US 7,319,621 B2
(45) Date of Patent: Jan. 15, 2008

(54) REDUCING DQ PIN CAPACITANCE IN A MEMORY DEVICE

(75) Inventor: Ben Ba, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/493,354

(22) Filed: Jul. 26, 2006

(65) Prior Publication Data

US 2007/0008788 A1    Jan. 11, 2007

Related U.S. Application Data

(62) Division of application No. 11/010,235, filed on Dec. 10, 2004, now Pat. No. 7,164,600.

(51) Int. Cl.
*G11C 7/10* (2006.01)
(52) U.S. Cl. ............ 365/189.05; 327/112; 365/185.02; 365/191
(58) Field of Classification Search ............... 326/30, 326/86, 87; 327/112; 365/189.05, 189.11, 365/191, 185.02
See application file for complete search history.

(56) References Cited

U.S. PATENT DOCUMENTS

| 6,055,191 | A  | 4/2000  | Sher et al.     |        |
|-----------|----|---------|-----------------|--------|
| 6,496,420 | B2 | 12/2002 | Manning         |        |
| 6,807,650 | B2 | 10/2004 | Lamb et al.     |        |
| 6,832,177 | B2 | 12/2004 | Khandekar et al.|        |
| 6,839,286 | B2 | 1/2005  | Cho et al.      |        |
| 6,924,660 | B2*| 8/2005  | Nguyen et al.   | 326/30 |
| 7,034,565 | B2 | 4/2006  | Lee             |        |
| 7,091,744 | B2 | 8/2006  | Song            |        |
| 7,148,721 | B2*| 12/2006 | Park            | 326/30 |
| 2005/0283671 | A1 | 12/2005 | Stave        |        |
| 2007/0030030 | A1*| 2/2007 | Waldrop       | 326/93 |

\* cited by examiner

*Primary Examiner*—Richard T. Elms
*Assistant Examiner*—Alexander Sofocleous
(74) *Attorney, Agent, or Firm*—Jones Day; Edward L. Pencoske

(57) ABSTRACT

A system and method to operate an electronic device, such as a memory chip, with a data driver circuit that is configured to reduce data pin (DQ) capacitance. In a driver circuit that is comprised of a set of ODT (On-Die Termination) legs and a set of non-ODT legs, a method according to the present disclosure allows selective activation and deactivation of tuning transistors in the ODT and non-ODT legs. During a default operational state of the electronic device (e.g., when no data read operation is taking place), the tuning transistors in the non-ODT legs may be maintained "turned off" or "disabled" to reduce DQ pin capacitance contributed by these tuning transistors had they been active during this default state. These non-ODT leg tuning transistors may be turned on, for example, when a data read operation is to be performed. Similarly, the tuning transistors in the ODT legs also may be selectively enabled/disabled to further control or reduce DQ pin capacitance as desired. The logic circuits disclosed to accomplish the reduction in DQ pin capacitance not only conserve the existing chip real estate, but also do not negatively affect the speed with which signals may be output from the electronic device.

20 Claims, 6 Drawing Sheets

REDUCING DQ PIN CAPACITANCE IN A MEMORY DEVICE

CROSS REFERENCE TO RELATED CASES

The present application is a divisional application of U.S. application Ser. No. 11/010,235 filed Dec. 10, 2004 now U.S. Pat. No. 7,164,600 and entitled Reducing the DQ Pin Capacitance in a Memory Device

BACKGROUND

1. Field of the Disclosure

The present disclosure generally relates to electronic devices and, more particularly, to a system and method to reduce DQ pin capacitance in semiconductor memory chips.

2. Brief Description of Related Art

Memory devices are electronic devices that are widely used in many electronic products and computers to store data. A memory device is a semiconductor electronic device that includes a number of memory cells, each cell storing one bit of data. The data stored in the memory cells can be read during a read operation. FIG. 1 is a simplified block diagram showing a memory chip or memory device 12. The memory chip 12 may be part of a DIMM (dual in-line memory module) or a PCB (printed circuit board) containing many such memory chips (not shown in FIG. 1). The memory chip 12 may include a plurality of pins or balls 24 located outside of chip 12 for electrically connecting the chip 12 to other system devices. Some of those pins 24 may constitute memory address pins or address bus 17, data (DQ) pins or data bus 18, and control pins or control bus 19. It is evident that each of the reference numerals 17-19 designates more than one pin in the corresponding bus. Further, it is understood that the schematic in FIG. 1 is for illustration only. That is, the pin arrangement or configuration in a typical memory chip may not be in the form shown in FIG. 1.

A processor or memory controller (not shown) may communicate with the chip 12 and perform memory read/write operations. The processor and the memory chip 12 may communicate using address signals on the address lines or address bus 17, data signals on the data lines or data bus 18, and control signals (e.g., a row address select (RAS) signal, a column address select (CAS) signal, etc. (not shown)) on the control lines or control bus 19. The "width" (i.e., number of pins) of address, data and control buses may differ from one memory configuration to another.

Those of ordinary skill in the art will readily recognize that memory chip 12 of FIG. 1 is simplified to illustrate one embodiment of a memory chip and is not intended to be a detailed illustration of all of the features of a typical memory chip. Numerous peripheral devices or circuits may be typically provided along with the memory chip 12 for writing data to and reading data from the memory cells 26. However, these peripheral devices or circuits are not shown in FIG. 1 for the sake of clarity.

The memory chip 12 may include a plurality of memory cells 26 generally arranged in rows and columns to store data in rows and columns. A row decode circuit 28 and a column decode circuit 30 may select the rows and columns in the memory cells 26 in response to decoding an address provided on the address bus 17. Data to/from the memory cells 26 is then transferred over the data bus 18 via sense amplifiers and a data output path (not shown). A memory controller (not shown) may provide relevant control signals (not shown) on the control bus 19 to control data communication to and from the memory chip 12 via an I/O (input/output) circuit 32. The I/O circuit 32 may include a number of data output buffers or output drivers to receive the data bits from the memory cells 26 and provide those data bits or data signals to the corresponding data lines in the data bus 18. An exemplary I/O circuit is discussed below with reference to FIG. 2.

The memory controller (not shown) may determine the modes of operation of memory chip 12. Some examples of the input signals or control signals (not shown in FIG. 1) on the control bus 19 include an External Clock signal, a Chip Select signal, a Row Access Strobe signal, a Column Access Strobe signal, a Write Enable signal, etc. The memory chip 12 communicates to other devices connected thereto via the pins 24 on the chip 12. These pins, as mentioned before, may be connected to appropriate address, data and control lines to carry out data transfer (i.e., data transmission and reception) operations.

FIG. 2 is a simplified diagram illustrating a portion of the I/O circuit 32 in the memory chip 12 shown in FIG. 1. The I/O circuit 32 is shown to include an output driver unit 34 connected to the data (DQ) pins 18 of the memory chip 12. The driver 34 receives the data signals (DQ Out) 38 from the memory cells 26 to be output on the DQ pins 18 (e.g., during a memory read operation). Thus, the DQ Out signals 38 may be generated internally within the chip 12. The I/O unit 32 may further include an impedance calibration circuit 36 for the DQ output driver 34. The impedance calibration circuit 36 may be used to tune various transistors (not shown in FIG. 2) in the output driver 34 as discussed hereinbelow with reference to FIG. 3. In a DDR (Double Data Rate) DRAM (Dynamic Random Access Memory) memory chip, the output driver 34 may also include a set of ODT (On-Die Termination) legs or circuit portion 40 and a set of non-ODT legs or circuit portion 42, which are discussed hereinbelow with reference to FIG. 3.

The on-chip ODT circuit 40 may be used to improve signal integrity in the system. An ODT pin (one of the pins 24 on the chip 12) may be provided on the chip to receive an externally-supplied (e.g., by a memory controller (not shown)) ODT enable/disable signal to activate/deactive the ODT circuit 40. Although the ODT circuit 40 in FIG. 2 is shown connected to the DQ pins 18, in practice, corresponding ODT circuits 40 may be provided for any other pins on the chip 12 including, for example, the address pins 17 and the control pins 19. The ODT circuit 40 may be more prevalent in DDR SDRAMs (Synchronous Dynamic Random Access Memories). In operation, the ODT circuit 40 provides desired termination impedance to improve signal integrity by controlling reflected noise on the transfer line connecting the memory chip 12 to another processing device, e.g., a memory controller (not shown). In a DDR SDRAM, the termination register (not shown) that was conventionally mounted on a motherboard carrying memory chips is incorporated inside the DDR SDRAM chip to enable or disable the ODT circuit 40 when desired. The termination register may be programmed through the ODT pin (not shown) by an external processor (e.g., a memory controller) to enable/disable the ODT circuit 40. As is known in the art, for example, when two memory chips 12 are loaded in a system, then during a memory write operation to one of the chips 12, the ODT circuit 40 in the other chip (which is not receiving data) is activated to absorb any signal propagations or reflections received on the data lines 18 (or address or control lines) of that "inactive" chip. This selective activation/deactivation of the ODT circuit 40 (e.g., in the memory chip that is not currently sending or receiving data) prevents the "inactive" chip from receiving spurious signals, thereby avoiding data corruption in the chip. The ODT circuit 40 thus improves signal (e.g., data signals) integrity in the memory chip 12. The non-ODT circuit portion 42 in the output driver 34 may provide routine signal driver functions to data signals as is known in the art.

FIG. 3 illustrates an exemplary circuit layout for a portion of the I/O circuit 32 shown in FIG. 2. The DQ Out lines 38 shown in FIG. 2 are not included in the circuit configuration of FIG. 3 for ease of illustration and clarity. As is known in the art and as can be seen from FIG. 3, the DQ output driver impedance calibration circuit 36 is connected to the pairs of tuning transistors of the ODT legs 40 and non-ODT legs 42 in the output driver 34. Each of the ODT and non-ODT legs is connected to a respective DQ pin 18 as shown in FIG. 3. The ODT legs 40 as well as the non-ODT legs 42 of the output driver 34 provide necessary signal amplification and buffering to the data signals to be sent from the memory cells 26 to the DQ pins 18. However, the ODT legs 40 may additionally provide the ODT functionality when activated. Thus, although the ODT and non-ODT legs may be identically constructed (as shown, for example, in FIG. 3), in operation of the driver 34, the ODT legs 40 may provide output driver function as well as the ODT functionality, whereas the non-ODT legs 42 may just provide the data output driver function (data signal amplification and buffering). Each output of the driver 34 may have an IC (integrated circuit) output pad (not shown) to convey the data signals to the corresponding DQ pins 18 as is known in the art. It is noted here that only a portion of the output driver 34 is shown in FIG. 3 with constituent circuit details for ease of illustration and clarity. For example, only two (44 and 52) of the "i" (i>1) ODT legs 40 and two (60 and 68) of the "j" (j>1) non-ODT legs are shown in FIG. 3.

Additional circuit details of FIG. 3 are known in the art and, hence, are not discussed in detail here. It is observed, however, that it is desirable to devise an output driver circuit configuration that reduces capacitance on output (DQ) pins without affecting the speed with which signals may be output from the electronic device. It is further desirable to obtain such output driver mechanism without significantly adding logic circuitry on the chip real estate.

SUMMARY

The present disclosure contemplates a method of operating an electronic device. The method comprises operating at least a portion of an output driver in the electronic device as an on die termination (ODT); and disabling at least one tuning transistor in a non-ODT portion of the output driver during a default operational state of the electronic device.

In one embodiment, the present disclosure contemplates a method of operating a memory device. The method comprises operating at least a portion of an output driver in the memory device as an ODT; and enabling at least one tuning transistor in a non-ODT portion of the output driver only during a data read operation involving the memory device.

In another embodiment, the present disclosure contemplates an electronic circuit, which comprises an output driver having an ODT portion and a non-ODT portion. A gate circuit in the output driver is coupled to the non-ODT portion and configured to maintain at least one tuning transistor in the non-ODT portion disabled during a default operational state of the electronic device.

In a different embodiment, the present disclosure contemplates a memory device and a computer system incorporating such memory device. The memory device comprises a plurality of memory cells to store data. An I/O circuit is configured to facilitate a data read/write operation from/to one or more of the plurality of memory cells, wherein the I/O circuit includes an output driver having an ODT portion and a non-ODT portion. A first gate circuit in the output driver is coupled to the non-ODT portion and is configured to maintain at least one tuning transistor in the non-ODT portion disabled during a default operational state of the memory device.

According to a system and method of the present disclosure an electronic device, such as a memory chip, is operated with a data driver circuit that is configured to reduce data pin (DQ) capacitance. In a driver circuit that is comprised of a set of ODT legs and a set of non-ODT legs, a methodology according to the present disclosure allows selective activation and deactivation of tuning transistors in the ODT and non-ODT legs. During a default operational state of the electronic device (e.g., when no data read operation is taking place), the tuning transistors in the non-ODT legs may be maintained in a "turned off" or "disabled" condition to reduce DQ pin capacitance contributed by these tuning transistors had they been active during this default state. These non-ODT leg tuning transistors may be turned on, for example, when a data read operation is to be performed. Similarly, the tuning transistors in the ODT legs also may be selectively enabled/disabled to further control or reduce DQ pin capacitance as desired. The logic circuits disclosed to accomplish the reduction in DQ pin capacitance not only conserve the existing chip real estate, but also do not negatively affect the speed with which signals may be output from the electronic device.

BRIEF DESCRIPTION OF THE DRAWINGS

For the present disclosure to be easily understood and readily practiced, the present disclosure will now be described for purposes of illustration and not limitation, in connection with the following figures, wherein.

DETAILED DESCRIPTION

Reference will now be made in detail to some embodiments of the present disclosure, examples of which are illustrated in the accompanying drawings. It is to be understood that the figures and descriptions of the present disclosure included herein illustrate and describe elements that are of particular relevance to the present disclosure, while eliminating, for the sake of clarity, other elements found in typical solid-state electronic devices, memories or memory-based systems. It is noted at the outset that the terms "connected", "connecting," "electrically connected," etc., are used interchangeably herein to generally refer to the condition of being electrically connected. It is further noted that various block diagrams and circuit diagrams shown and discussed herein employ logic circuits that implement positive logic, i.e., a high value on a signal is treated as a logic "1" whereas a low value is treated as a logic "0." However, any of the circuits discussed herein may be easily implemented in negative logic (i.e., a high value on a signal is treated as a logic "0" whereas a low value is treated as a logic "1").

Figure 4:
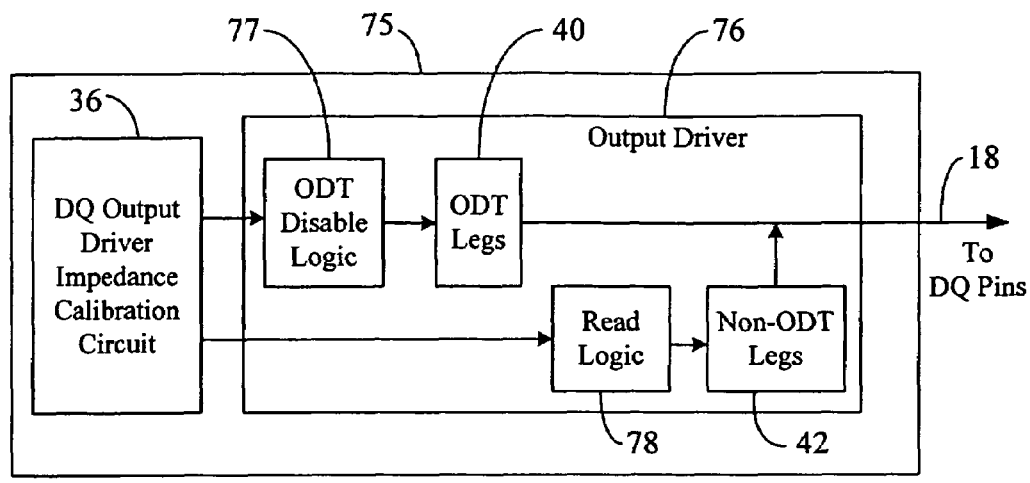
FIG. 4 depicts an exemplary block diagram of an I/O circuit according to one embodiment of the present disclosure.

FIG. 4 depicts an exemplary block diagram of an I/O circuit 75 according to one embodiment of the present disclosure. A comparison of the I/O circuits 32 and 75 in FIGS. 2 and 4, respectively, shows that an output driver 76 in the I/O circuit 75 includes two logic circuits—an ODT disable logic unit 77 and a Read logic unit 78—in addition to the other components, which are common between the circuits 32 and 75. The circuit elements shared by the I/O circuits 32 and 75 (e.g., the impedance calibration circuit 36, the ODT legs 40, etc.) are not discussed hereinbelow because of their discussion provided hereinbefore under the "Background" section. As discussed with reference to FIG. 5 in more detail, the logic units 77 and 78 may be configured to provide selective activation/deactivation of the tuning transistors in the respective output driver legs—the ODT disable logic unit 77 operating on the ODT legs 40, whereas the Read logic unit 78 operating on the associated non-ODT legs 42 as shown in more detail in FIG. 5. The tuning signals from the calibration circuit 36 are applied to the ODT legs 40 via the ODT disable logic unit 77, and to the non-ODT legs 42 via the Read logic unit 78. The DQ Out input 38 to the I/O circuit 75 is not shown in FIG. 4 for sake clarity and ease of illustration. However, it is evident that such and other inputs are identical between the I/O circuits 32 and 75 in FIGS. 2 and 4, respectively.

According to one embodiment of the present disclosure, the Read logic unit 78 may be configured to turn off or disable the non-ODT leg tuning transistors to reduce DQ capacitance during a default operational state of the output driver 76. In one embodiment, the default operational state may include all operational states during which no data read operation is taking place using the output driver 76. Similarly, in another embodiment, the default operational state may include all operational states during which no data write operation is taking place in a data write path (not shown). For example, the non-ODT leg tuning transistors may remain turned off so long as there is no memory data read operation being performed. A Read signal (discussed below with reference to FIG. 5), when applied to the Read logic unit 78, may then turn on or enable the turned-off tuning transistors in non-ODT legs 42 to allow data output with correct impedance. Those turned-on transistors may be turned off again after the data read is completed. In this manner, the DQ pin capacitance caused by "on" or "active" tuning transistors in non-ODT legs 42 may be significantly reduced by maintaining the tuning transistors of the non-ODT legs 42 turned-off or disabled during the default operational state of the output driver 76. A similar activation/deactivation may be performed on relevant transistor elements (not shown) in a data write path during a data write operation. The ODT disable logic unit 77 may be similarly configured to perform selective activation/deactivation of the tuning transistors in the ODT legs 40 as discussed below with reference to FIG. 5.

Figure 5:
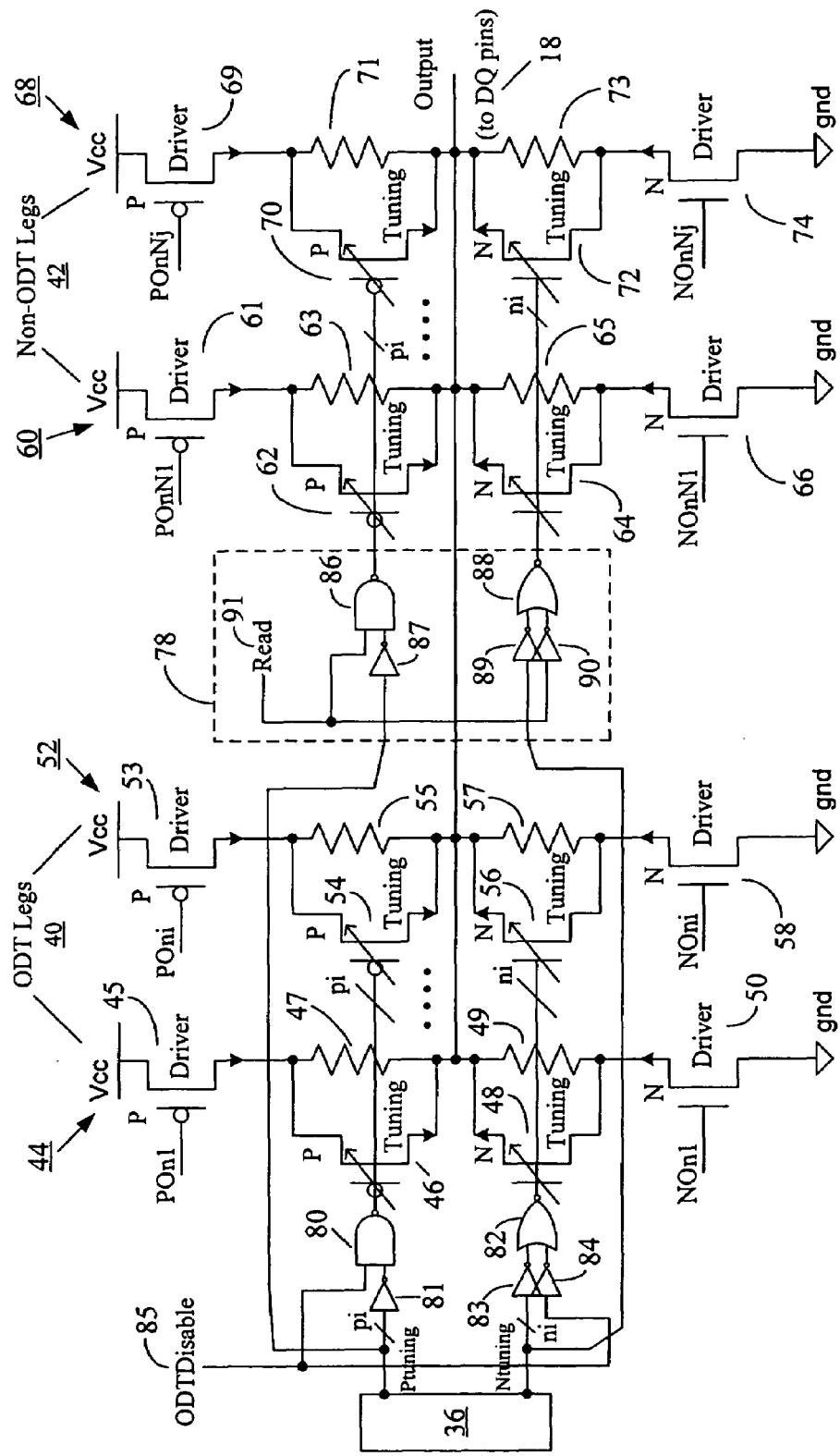
FIG. 5 illustrates an exemplary circuit configuration for a portion of the I/O circuit shown in the block diagram of FIG. 4.

FIG. 5 illustrates an exemplary circuit configuration for a portion of the I/O circuit 75 shown in the block diagram of FIG. 4. The construction of ODT legs 40 and non-ODT legs 42 is similar in FIGS. 3 and 5. However, in the embodiment of FIG. 5, the ODT leg tuning transistors are connected to the impedance calibration circuit 36 via the ODT disable logic unit 77 comprising an NAND gate 80, an NOR gate 82, and three inverters 81, 83, and 84. Similarly, the non-ODT leg tuning transistors are connected to the impedance calibration circuit 36 via the Read logic unit 78 comprising an NAND gate 86, an NOR gate 88, and three inverters 87, 89, and 90. As shown in FIG. 5, in one embodiment, the construction of the logic units 77 and 78 may be identical. There may be "$p_i$" number of "upper arm" circuits including the NAND gate 80 and the inverter 81 for the ODT legs 40, or the NAND gate 86 and the inverter 87 for the non-ODT legs. Each output of the "upper arm" circuits may be connected to an individual one of the "$p_i$" parallel tuning transistors in the ODT legs 40 or the non-ODT legs 42, as the case may be, to accomplish individual tuning of the parallel tuning transistors. Similarly, there may be "$n_i$" number of "lower arm" circuits including the trio of the NOR gate 82 and the inverters 83-84, or the NOR gate 88 and the inverters 89-90. The "lower arm" circuits may be similarly connected to the "$n_i$" parallel tuning transistors in the ODT legs 40 and the non-ODT legs 42 to accomplish tuning of these "lower" tuning transistors.

Each ODT leg (44, 52) and each non-ODT leg (60, 68) may include a P-channel driver transistor (45, 53, 61, and 69); a first set of multiple ($p_i \geqq 1$) parallel P-channel tuning transistors (46, 54, 62, and 70), with each such transistor connected in parallel with a respective resistor (47, 55, 63, and 71) of a predetermined value; a second set of multiple ($n_i \geqq 1$) parallel N-channel tuning transistors (48, 56, 64, and 72), with each such transistor connected in parallel with a respective resistor (49, 57, 65, and 73) of a predetermined value; and an N-channel driver transistor (50, 58, 66, and 74). Each tuning transistor has its own control and can be individually controlled (tuned) using the calibration circuit 36. The biasing for the ODT and non-ODT legs may be provided as shown in FIG. 5. Only one of the "$p_i$" P-channel tuning transistors and one of the "$n_i$" N-channel tuning transistors are shown in FIG. 5 for the sake of clarity and ease of illustration. Various transistors (drivers or tuning) shown in FIG. 5 may be constructed using the CMOS (Complementary Metal Oxide Semiconductor) fabrication technology. The impedance calibration circuit 36 may provide necessary tuning signals for P- and N-channel tuning transistors in the ODT 40 and non-ODT legs 42 to obtain impedance matching and balancing during data read operations over DQ pins 18. The constructional details of the calibration circuit 36 are known in the art and, hence, are not provided herein for the sake of brevity.

Each set of tuning transistors (e.g., transistors 46 and 48 in ODT leg 44) in the ODT as well as in the non-ODT legs may be identically-tuned using the impedance calibration circuit 36 to provide balanced impedance to the data signals or balanced termination (in case of ODT functionality). As noted before, the ODT and non-ODT legs 40, 42 terminate corresponding DQ pins 18 at their respective IC output pads (not shown). Portions of the legs 40, 42, may function as the "pull-up" legs whereas the remainder of the legs 40, 42 may function as the "pull-down" legs as is known in the art. For example, in case of the ODT leg 44, the driver transistor 45 and the tuning transistor 46 (with its resistor 47) may form a "pull-up" leg portion whereas the driver transistor 50 and the tuning transistor 48 (and its resistor 49) may form a "pull-down" leg portion. Other ODT and non-ODT legs may have similar pull-up and pull-down leg portions. The activation signals to "turn on" various driver transistors in FIG. 5 are indicated as $POn_1 \ldots POn_1$ for the P-channel drivers in ODT legs 40, $NOn_i \ldots NOn_i$ for the N-channel drivers in the ODT legs 40, $POnN_1 \ldots POnN_j$ for the P-channel drivers in the non-ODT legs 42, and $NOnN_1 \ldots NOnN_j$ for the N-channel drivers in the non-ODT legs 42 as shown in FIG. 5. The generation and operation of these activation signals are known in the art and, hence, are not discussed herein for the sake of brevity.

Figure 2:
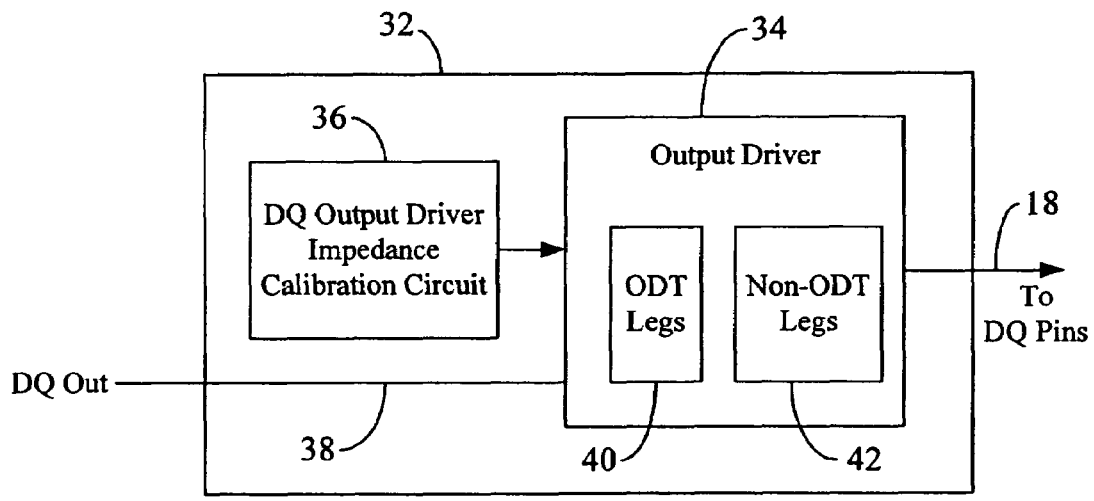
FIG. 2 is a simplified diagram illustrating a portion of the I/O circuit in the memory chip shown in FIG. 1.
Figure 3:
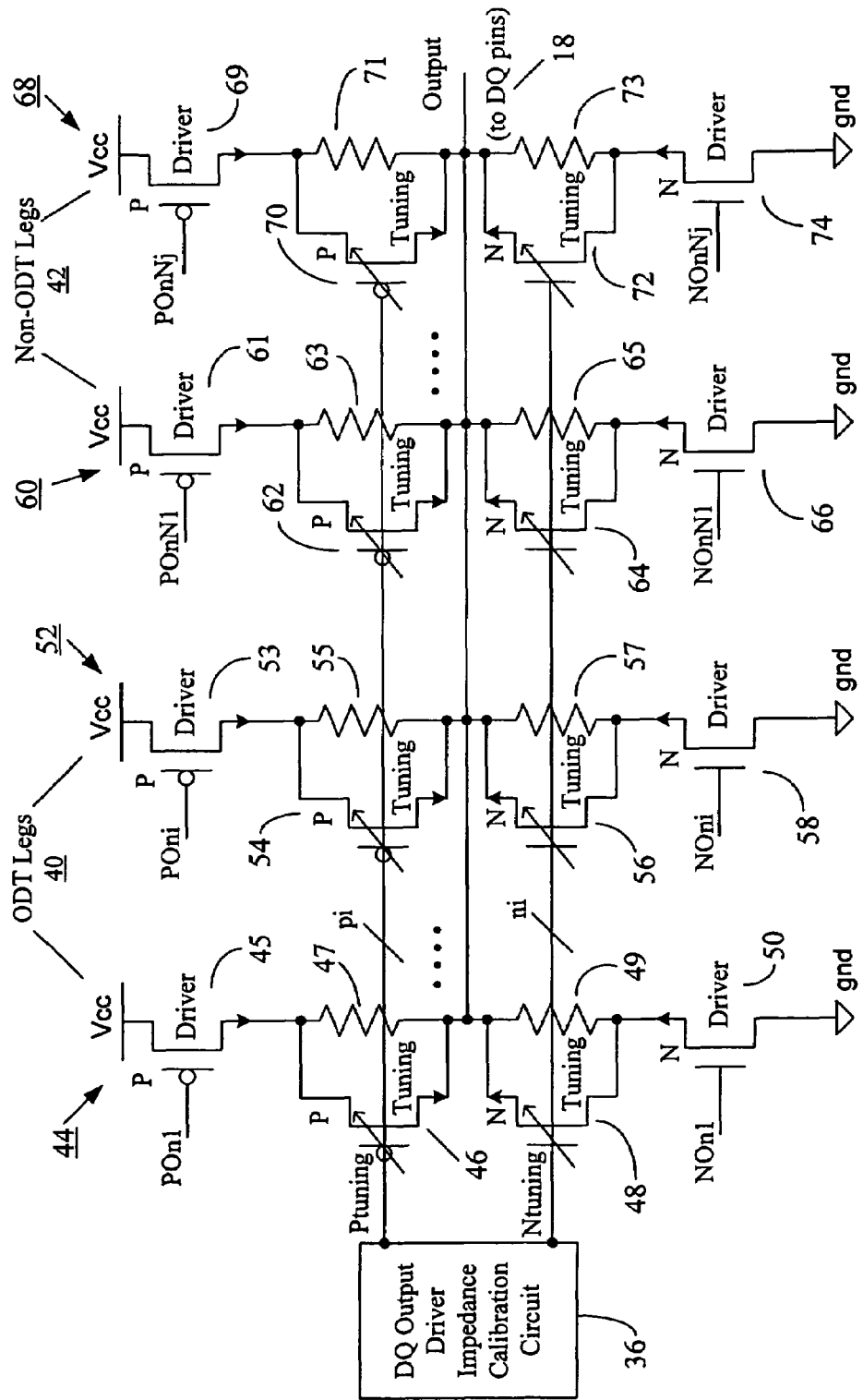
FIG. 3 is an exemplary circuit layout for a portion of the I/O circuit shown in FIG. 2.

In the output driver circuit configuration shown in FIG. 5, the ODT circuit 40 has been incorporated as a part of the driver circuit 34 instead of separate from it (as may be the case in some other prior art driver configurations). Because the ODT functionality is not provided by a circuit portion that is separate from the circuit portion providing the driver functionality (as in some other prior art driver configurations), the problem of DQ pin capacitance contributed by a separate ODT is not present in the configuration of FIG. 5. However, there is still a significant capacitance at DQ pins 18 (especially in high speed DRAMs operating at data rates of 1333 MHz and above) in the configuration of FIG. 5, and, hence, it is desirable to further reduce the DQ pin capacitance even when the ODT is an in-built part of the output driver (as shown in FIGS. 2-3 and 5). For example, in some DDR DRAM memory chips, the DQ pin capacitance can vary from 0.25 pF to 0.30 pF over the tuning range of the corresponding driver leg. A high DQ pin capacitance may cause capacitive loading of the DQ pin and may negatively affect chip performance during routine high speed data transfer operations (e.g., typical memory read/write operations during run time). The high DQ pin capacitance may also cause jitter on output signals (DQ signals), and may significantly deteriorate quality of receiving input signals of data writes and output signals during data reads.

It is seen from the embodiment of FIG. 5 that a Read signal (active "high") at the Read input 91 will enable the tuning of the tuning transistors in the non-ODT legs to obtain output data with correct impedance. After the read operation is over, the Read signal may be maintained "low" to turn off or disable these tuning transistors in the non-ODT legs 42. Similarly, the ODT Disable input 85 (active "low") may be used to turn off the ODT leg tuning transistors if needed. For example, in one operational state of the output driver 76, it may be desirable to maintain ODT enabled, and, hence, the ODT Disable input 85 may remain unasserted. However, if the ODT is to be disabled, the corresponding tuning transistors in the ODT legs 40 may also be turned off or disabled to further reduce capacitance on respective DQ pins 18 during this alternative operational state of the output driver 76. When the tuning transistors in the ODT and non-ODT legs are disabled, the outputs of the impedance calibration circuit 36 may not be applied to these transistors, thereby preventing the circuit 36 from tuning the deactivated transistors. The capacitance at respective DQ pins 18 may be thus reduced by selective activation or deactivation of the ODT and non-ODT leg tuning transistors. The simplicity of the circuits (i.e., the ODT disable logic unit 77 and the Read logic unit 78) needed to accomplish such capacitance reduction results in a minimal consumption of the valuable chip real estate. That is, the chip real estate is not wasted and, hence, is available to include other circuits that a designer may feel desirable to incorporate in the chip design.

Figure 6:
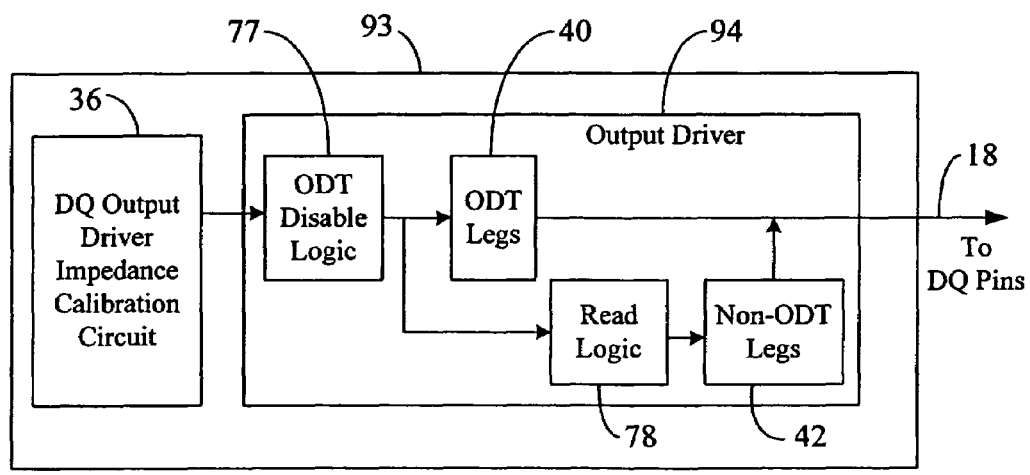
FIG. 6 shows an exemplary block diagram of an I/O circuit according to another embodiment of the present disclosure.

FIG. 6 shows an exemplary block diagram of an I/O circuit 93 according to another embodiment of the present disclosure. The output driver 94 in FIG. 6 contains elements similar to those shown as part of the driver 76 in FIG. 4. However, in the embodiment of FIG. 6, the tuning signal inputs to the Read logic unit 78 in the driver 94 are received from the outputs of the ODT disable logic unit 77 and not from the calibration circuit 36. Because of the substantial similarity between various circuit blocks in FIGS. 4 and 6 and because of the self-explanatory nature of the tuning signal propagation arrangement in FIG. 6, no additional discussion is provided herein for the I/O circuit 93 depicted in FIG. 6.

Figure 7:
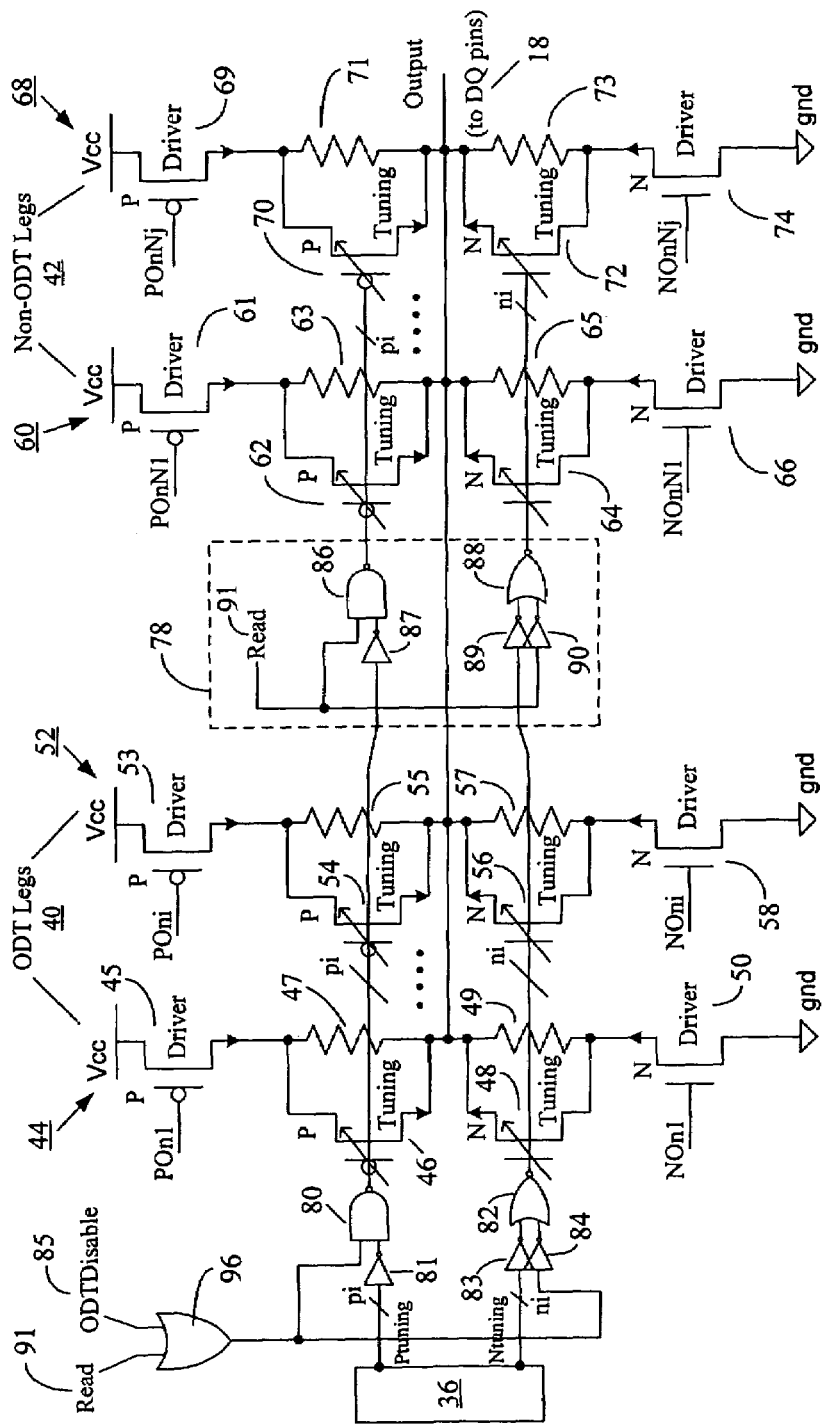
FIG. 7 depicts an exemplary circuit configuration for a portion of the I/O circuit shown in the block diagram of FIG. 6.

FIG. 7 depicts an exemplary circuit configuration for a portion of the I/O circuit 93 shown in the block diagram of FIG. 6. The circuit configuration in FIG. 7 implements the circuit block arrangement shown in FIG. 6, just like the circuit configuration in FIG. 5 implementing the block diagram illustrated in corresponding FIG. 4. It is seen from FIG. 7 that the tuning signals from the impedance calibration circuit 36 reach the read logic unit 78 as outputs from the intervening circuit elements (80-84) that constitute the ODT disable logic unit 77. The circuit configuration of FIGS. 6 and 7 may be preferable when extra die size for a memory wafer is not available or not desirable. In the embodiment of FIGS. 4 and 5, such extra die size may be needed to accommodate separate tuning signal routes for the ODT disable logic 77 and the Read logic 78. Because of the substantial similarity between circuit configurations in FIGS. 5 and 7 and because of the self-explanatory nature of the tuning signal propagation arrangement in FIG. 7, no additional discussion is provided herein for the portion of the I/O circuit 93 depicted in FIG. 7. It is noted, however, that an OR gate 96 is added in the circuit configuration of FIG. 7 (as opposed to the configuration in FIG. 5) to receive the ODT Disable signal 85 (active "low") and the Read signal 91 (active "high") as inputs thereto. The output of this OR gate 96 is then supplied as a signal that may activate/deactivate the ODT disable logic unit represented by its constituent logic elements 80-84 in FIG. 7. This arrangement may be preferable in the embodiment of FIG. 7 (as opposed to the direct input of the ODT Disable signal 85 to the ODT disable logic 77 as in FIG. 5) to allow ODT legs 40 to output data with correct impedance during data read operations even if the ODT Disable is asserted "low." Thus, the ODT Disable signal 85 may not be able to turn off the tuning transistors in the ODT legs 40 in FIG. 7 when a data read operation is taking place.

Figure 1:
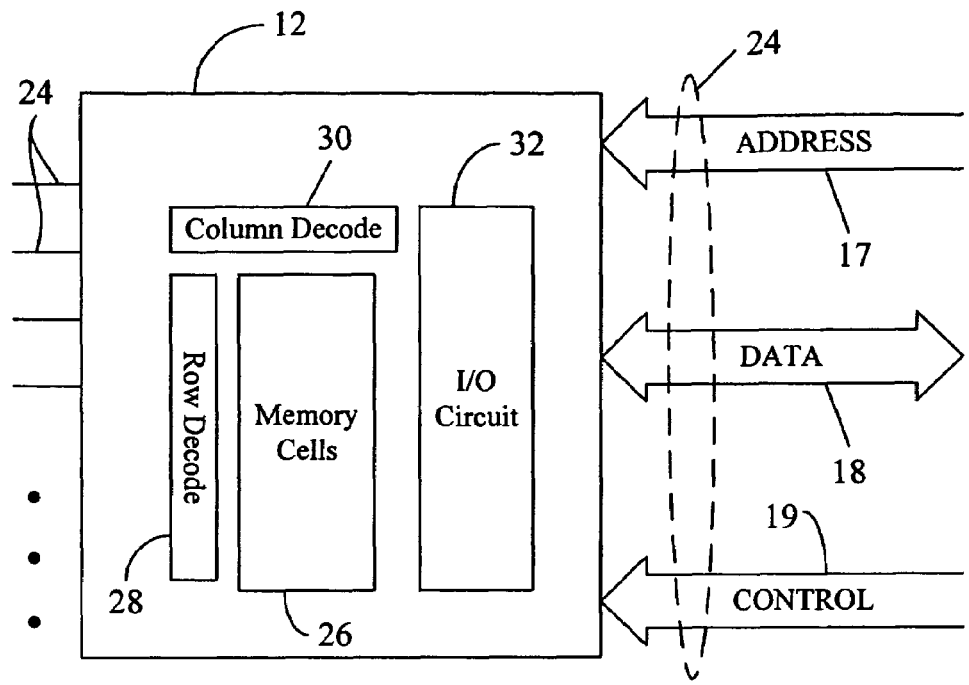
FIG. 1 is a simplified block diagram showing a memory chip or memory device.
Figure 8:
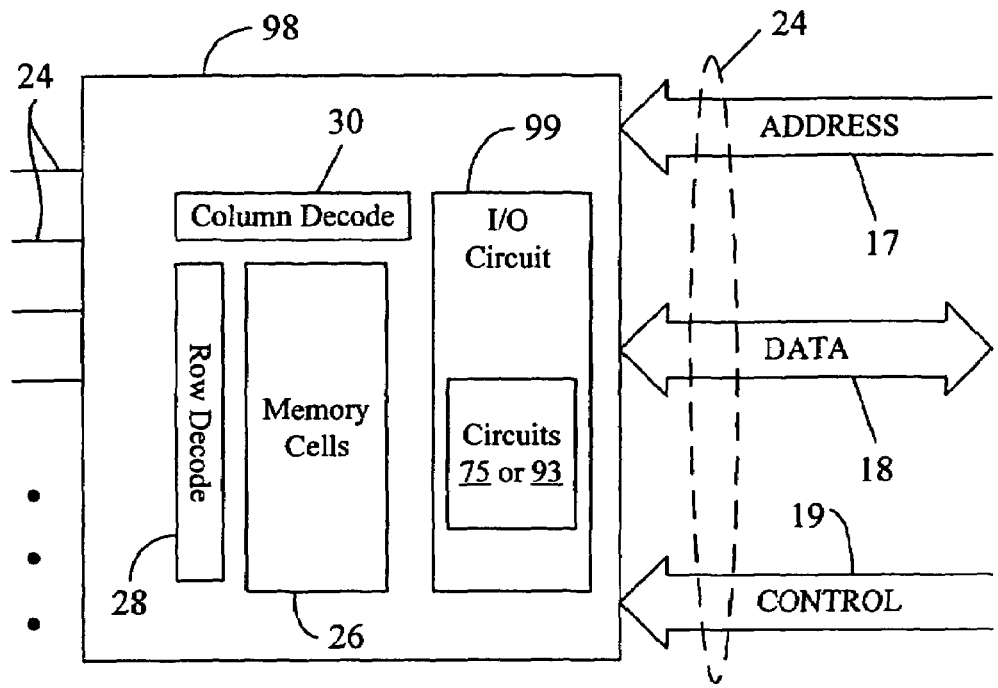
FIG. 8 is a simplified block diagram showing a memory chip that employs one of the I/O circuits illustrated by way of examples in FIGS. 4-5 and 6-7.

FIG. 8 is a simplified block diagram showing a memory chip 98 that employs one of the I/O circuits 75 or 93 illustrated by way of examples in FIGS. 4-5 and 6-7, respectively. Thus, the I/O circuit 99 in FIG. 8 is illustrated to include one of the I/O circuits 75 or 93 depending on the desired circuit design. The memory chip 98 can be a dynamic random access memory (DRAM) or another type of memory circuits such as SRAM (Static Random Access Memory) or Flash memories. Furthermore, the DRAM could be a synchronous DRAM commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink or Rambus DRAMs. In one embodiment, the memory chip 98 is a DDR DRAM operating at a clock frequency of 667 MHz and an I/O data rate of 1334 MHz. The circuit configuration in FIG. 5 or 7 may be part of the I/O circuit 99 in the memory chip 98. It is noted here that although other elements in the memory chip 98 are designated with the same reference numerals as those given in FIG. 1, it may be possible that those components having same reference numerals may not be identical in the memories 12 and 98. For example, the DQ output driver impedance calibration circuit 36 in the I/O circuit 99 in the memory chip 98 may be different from the calibration circuit 36 in the I/O circuit 32 in chip 12 to take into account the new output driver configurations illustrated in FIGS. 5 and 7. However, for the sake of simplicity, units with similar functionality are denoted by same reference numerals in FIGS. 1 and 8.

Figure 9:
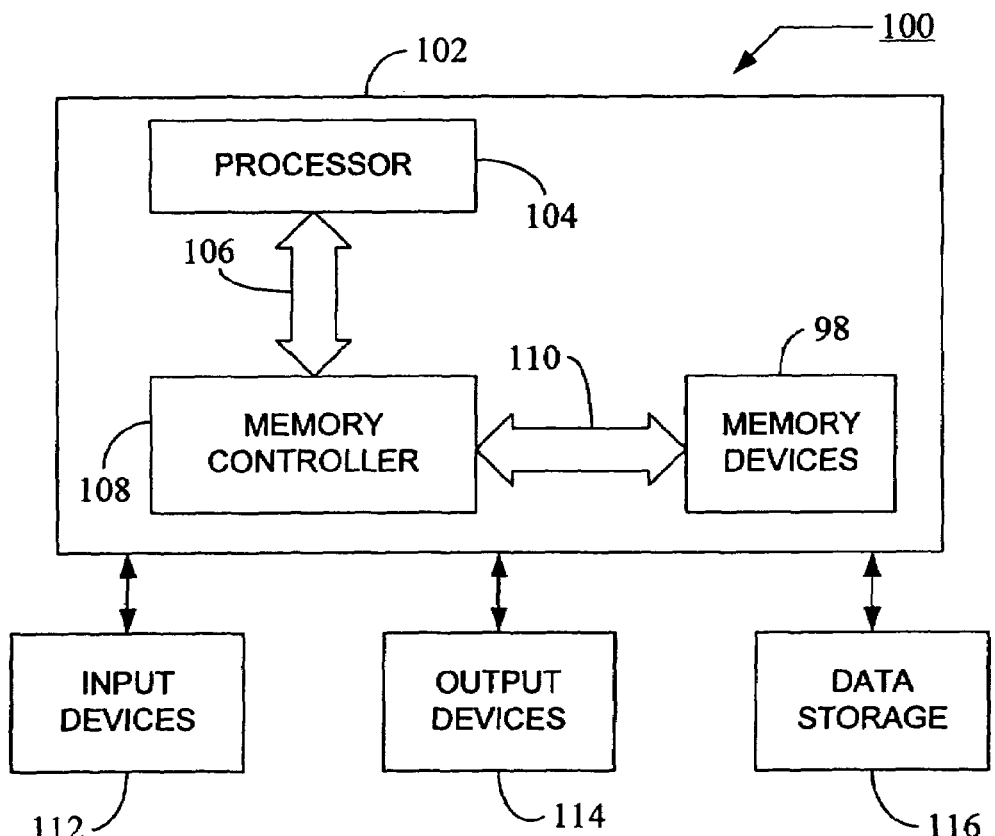
FIG. 9 is a block diagram depicting a system in which one or more memory chips illustrated in FIG. 8 may be used.

FIG. 9 is a block diagram depicting a system 100 in which one or more memory chips 98 illustrated in FIG. 8 may be used. The system 100 may include a data processing unit or computing unit 102 that includes a processor 104 for performing various computing functions, such as executing specific software to perform specific calculations or data processing tasks. The computing unit 102 also includes a memory controller 108 that is in communication with the processor 104 through a bus 106. The bus 106 may include an address bus (not shown), a data bus (not shown), and a control bus (not shown). The memory controller 108 is also in communication with a set of memory devices 98 (i.e., multiple memory chips 98 of the type shown in FIG. 8) through another bus 110 (which may be similar to the bus 24 shown in FIG. 8). In one embodiment, each memory device 98 is a DDR3 DRAM operating at a clock frequency of 667 MHz and a data I/O rate of 1334 MHz. Each memory device 98 may include appropriate data storage and retrieval circuitry (not shown in FIG. 9) as shown in FIG. 8. The processor 104 can perform a plurality of functions based on information and data stored in the memories 98.

The memory controller 108 can be a microprocessor, digital signal processor, embedded processor, micro-controller, dedicated memory test chip, a tester platform, or the like. The memory controller 108 may control routine data transfer operations to/from the memories 98, for example, when the memory devices 98 are part of an operational computing system 102. The memory controller 108 may reside on the same motherboard (not shown) as that carrying the memory chips 98. Various other configurations of electrical connection between the memory chips 98 and the memory controller 108 may be possible. For example, the memory controller 108 may be a remote entity communicating with the memory chips 98 via a data transfer or communications network (e.g., a LAN (local area network) of computing devices).

The system 100 may include one or more input devices 112 (e.g., a keyboard or a mouse) connected to the computing unit 102 to allow a user to manually input data, instructions, etc., to operate the computing unit 102. One or more output devices 114 connected to the computing unit 102 may also be provided as part of the system 100 to display or otherwise output data generated by the processor 104. Examples of output devices 114 include printers, video terminals or video display units (VDUs). In one embodiment, the system 100 also includes one or more data storage devices 116 connected to the data processing unit 102 to allow the processor 104 to store data in or retrieve data from internal or external storage media (not shown). Examples of typical data storage devices 116 include drives that accept hard and floppy disks, CD-ROMs (compact disk read-only memories), and tape cassettes. As noted before, the memory devices 98 in the computing unit 102 have the configuration illustrated in FIG. 8, i.e., each memory device 98 includes an I/O circuit 99.

It is observed that although the discussion given hereinbefore has been primarily with reference to memory devices, it is evident that the signal output driver configurations illustrated in FIGS. 4-5 or FIGS. 6-7 may be employed, with suitable modifications which may be evident to one skilled in the art, in any non-memory electronic device that may utilize a signal driver circuit having ODT and non-ODT legs as illustrated, for example, in FIG. 3.

The foregoing describes a system and method to operate an electronic device, such as a memory chip, with a data driver circuit that is configured to reduce data pin (DQ) capacitance. In a driver circuit that is comprised of a set of ODT (On-Die Termination) legs and a set of non-ODT legs, a methodology according to the present disclosure allows selective activation and deactivation of tuning transistors in the ODT and non-ODT legs. During a default operational state of the electronic device (e.g., when no data read operation is taking place), the tuning transistors in the non-ODT legs may be maintained in a "turned off" or "disabled" condition to reduce DQ pin capacitance contributed by these tuning transistors had they been active during this default state. These non-ODT leg tuning transistors may be turned on, for example, when a data read operation is to be performed. Similarly, the tuning transistors in the ODT legs also may be selectively enabled/disabled to further control or reduce DQ pin capacitance as desired. The logic circuits disclosed to accomplish the reduction in DQ pin capacitance not only conserve the existing chip real estate, but also do not negatively affect the speed with which signals may be output from the electronic device.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

What is claimed is:

1. An electronic circuit, comprising:
   an output driver having an ODT (on die termination) portion and a non-ODT portion; and
   a first gate circuit in said output driver coupled to said non-ODT portion and configured to maintain at least one tuning transistor in said non-ODT portion disabled during a default operational state of said electronic circuit.

2. The electronic circuit of claim 1, further comprising:
   an impedance calibration circuit configured to operate on said at least one tuning transistor in said non-ODT portion, wherein outputs of said impedance calibration circuit are applied to said at least one tuning transistor via said first gate circuit.

3. The electronic circuit of claim 2, further comprising:
   a second gate circuit in said output driver coupled to said ODT portion and configured to maintain at least one tuning transistor in said ODT portion enabled during a first operational state of said output driver and disabled during a second operational state of said output driver, wherein said impedance calibration circuit is further configured to operate on said at least one tuning transistor in said ODT portion, and wherein said outputs of said impedance calibration circuit are applied to said at least one tuning transistor in said ODT portion via said second gate circuit.

4. The electronic circuit of claim 1, wherein said first gate circuit is further configured to enable said at least one tuning transistor in said non-ODT portion during a data read operation.

5. The electronic circuit of claim 1, wherein said first gate circuit is further configured to enable said at least one tuning transistor in said non-ODT portion during a data write operation.

6. The electronic circuit of claim 1, wherein said ODT portion is incorporated as a part of the output driver.

7. An electronic circuit, comprising:
an output driver having an ODT (on die termination) portion and a non-ODT portion; and
a first gate circuit in said output driver coupled to said ODT portion and configured to maintain at least one tuning transistor in said ODT portion enabled during a default operational state of said electronic circuit.

8. The electronic circuit of claim 7, further comprising:
an impedance calibration circuit configured to operate on said at least one tuning transistor in said ODT portion, wherein outputs of said impedance calibration circuit are applied to said at least one tuning transistor via said first gate circuit.

9. The electronic circuit of claim 7, wherein said first gate circuit is further configured to disable said at least one tuning transistor in said ODT portion during a data read operation.

10. The electronic circuit of claim 7, wherein said first gate circuit is further configured to disable said at least one tuning transistor in said ODT portion during a data write operation.

11. The electronic circuit of claim 7, wherein said ODT portion is incorporated as a part of the output driver.

12. An electronic circuit, comprising:
an ODT (on die termination) portion;
a non-ODT portion;
a first gate circuit coupled to said ODT portion and configured to operate at least one tuning transistor in said ODT portion; and
a second gate circuit coupled to said non-ODT portion and configured to operate at least one tuning transistor in said non-ODT portion, wherein said first gate circuit is further configured to operate on said at least one tuning transistor in said non-ODT portion, wherein outputs of said first gate circuit are applied to said at least one tuning transistor via said second gate circuit.

13. The electronic circuit of claim 12, further comprising:
an impedance calibration circuit configured to operate on said at least one tuning transistor in said ODT portion, wherein outputs of said impedance calibration circuit are applied to said at least one tuning transistor via said first gate circuit.

14. The electronic circuit of claim 12, wherein said first gate circuit is configured to be responsive to P and N tuning signals.

15. The electronic circuit of claim 14, wherein said first gate circuit is configured to be responsive to an ODT signal.

16. The electronic circuit of claim 12, wherein said second gate circuit is configured to be responsive to a read signal.

17. An electronic circuit, comprising:
a plurality of drive transistors;
a first plurality of tuning transistors, each connected in series with certain of said plurality of drive transistors;
a second plurality of tuning transistors, each connected in series with certain other of said plurality of drive transistors;
a first gate circuit configured to control said first plurality of tuning transistors; and
a second gate circuit configured to control said second plurality of tuning transistors, said second gate circuit being responsive to said first gate circuit.

18. The electronic circuit of claim 17, wherein said first gate circuit is configured to be responsive to P and N tuning signals.

19. The electronic circuit of claim 18, wherein said first gate circuit is configured to be responsive to read and ODT signals.

20. The electronic circuit of claim 17, wherein said second gate circuit is configured to be responsive to a read signal.

* * * * *

UNITED STATES PATENT AND TRADEMARK OFFICE
CERTIFICATE OF CORRECTION

| | | |
|---|---|---|
| PATENT NO. | : 7,319,621 B2 | Page 1 of 1 |
| APPLICATION NO. | : 11/493354 | |
| DATED | : January 15, 2008 | |
| INVENTOR(S) | : Ba | |

It is certified that error appears in the above-identified patent and that said Letters Patent is hereby corrected as shown below:

On the title page, item (57), under "Abstract", in column 2, lines 5–6, after "a method" delete "according to the present disclosure".

Signed and Sealed this

Sixth Day of May, 2008

JON W. DUDAS
*Director of the United States Patent and Trademark Office*